(12) United States Patent
Steiner et al.

(10) Patent No.: US 7,319,598 B2
(45) Date of Patent: Jan. 15, 2008

(54) ELECTRONIC COMPONENT WITH A HOUSING PACKAGE

(75) Inventors: Rainer Steiner, Regensburg (DE);
Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 61 days.

(21) Appl. No.: 10/519,215

(22) PCT Filed: Jun. 25, 2003

(86) PCT No.: PCT/DE03/02119

§ 371 (c)(1),
(2), (4) Date: Sep. 19, 2005

(87) PCT Pub. No.: WO2004/003991

PCT Pub. Date: Jan. 8, 2004

(65) Prior Publication Data

US 2006/0126313 A1   Jun. 15, 2006

(30) Foreign Application Priority Data

Jun. 26, 2002   (DE) ................... 102 28 593

(51) Int. Cl.
*H05K 7/00* (2006.01)
(52) U.S. Cl. ..................................... 361/760
(58) Field of Classification Search ................ 361/719, 361/679, 728–729, 760, 736–737, 746
See application file for complete search history.

(56) References Cited

U.S. PATENT DOCUMENTS

| | | | |
|---|---|---|---|
| 3,691,289 A * | 9/1972 | Rohloff | 174/529 |
| 5,432,677 A | 7/1995 | Mowatt et al. | 361/719 |
| 5,874,780 A | 2/1999 | Murakami | 257/775 |
| 6,204,089 B1 | 3/2001 | Wang | 438/108 |
| 6,455,442 B1 * | 9/2002 | Bauer et al. | 438/780 |
| 6,544,814 B1 | 4/2003 | Yasunaga et al. | 438/108 |
| 2001/0001293 A1 | 5/2001 | Gotoh et al. | 438/107 |
| 2002/0041033 A1 | 4/2002 | Murayama et al. | 257/774 |
| 2003/0127725 A1 | 7/2003 | Sugaya et al. | 257/700 |

FOREIGN PATENT DOCUMENTS

| | | |
|---|---|---|
| EP | 0920058 | 6/1999 |
| EP | 1041624 | 10/2000 |
| EP | 1111674 | 6/2001 |
| EP | 1069616 | 10/2001 |
| JP | 08124950 | 5/1996 |
| JP | 08125344 | 5/1996 |
| JP | 08181175 | 7/1996 |
| JP | 08204332 | 8/1996 |
| JP | 09162553 | 6/1997 |

* cited by examiner

*Primary Examiner*—Javaid H. Nasri
(74) *Attorney, Agent, or Firm*—Dicke, Billig & Czaja

(57) ABSTRACT

The invention relates to an electronic component with a housing package comprising a number of layers of plastic with at least one buried interconnect layer and with at least one semiconductor chip, which has pointed-conical external contacts distributed on an outer side. The pointed-conical external contacts penetrate through one of the layers of plastic and form contact vias with respect to the buried interconnect layer. Furthermore, the invention relates to a method for producing such an electronic component.

5 Claims, 4 Drawing Sheets

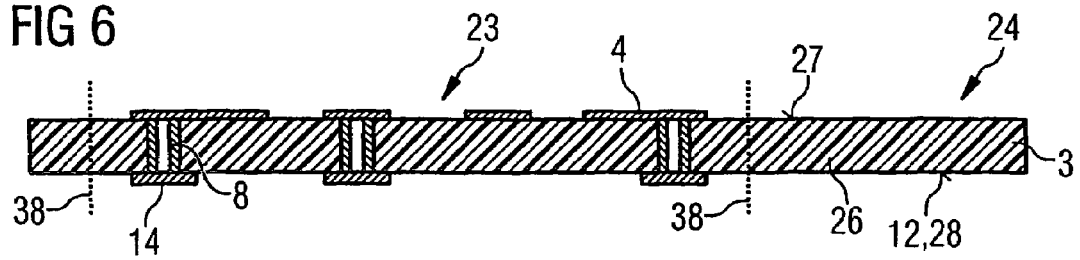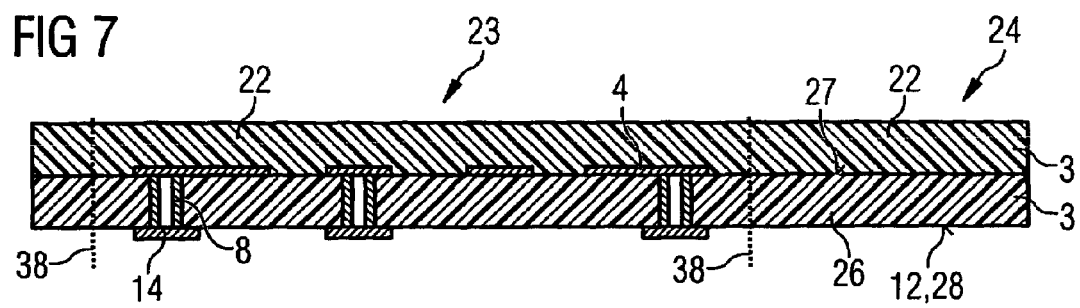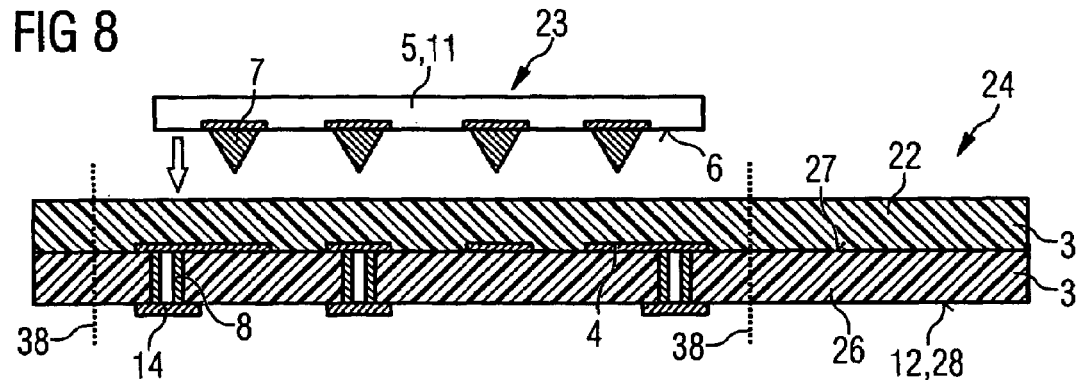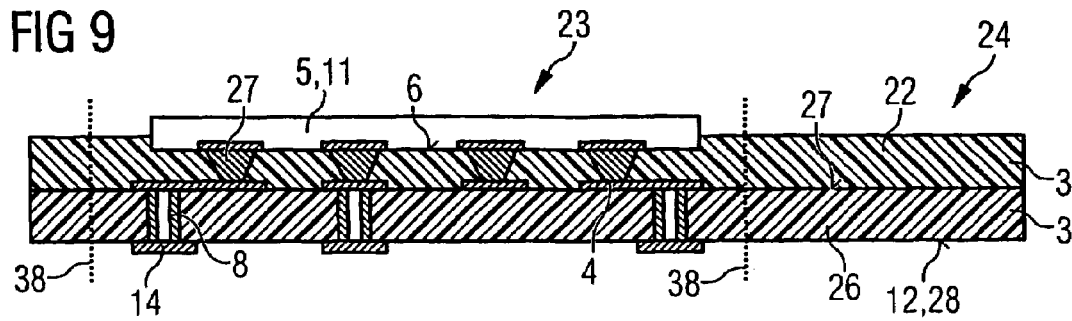

ELECTRONIC COMPONENT WITH A HOUSING PACKAGE

CROSS REFERENCE TO RELATED APPLICATION

This Utility Patent Application claims the benefit of the filing date of Application No. DE 102 28 593.4, filed Jun. 26, 2002 and International Application No. PCT/DE03/02119, filed Jun. 25, 2003, both of which are herein incorporated by reference.

FIELD OF THE INVENTION

The invention relates to an electronic component with a housing package comprising a number of layers of plastic with at least one buried interconnect and with at least one semiconductor chip and also to a method for the simultaneous production of a number of such electronic components.

BACKGROUND

The reduction in size of subassemblies in many areas of electronics requires an ever greater integration density of components both on printed circuit boards and in a housing package. However, the contacting of the contact areas of the semiconductor chip with corresponding contact terminal areas on a wiring board or a leadframe takes up considerable space in the housing package, because wire connections known as bonding connections have to be created between the contact areas and the contact terminal areas.

In the case of a flip-chip connection, although the connecting technique in a housing package by means of external contacts in the form of balls applied to the semiconductor chip is achieved without any wire bonding, because the external contacts can be soldered directly onto a wiring board or onto a leadframe. There is a considerable intermediate space between the semiconductor chip and either the wiring board or a leadframe, which subsequently has to be filled by what is known as underfill, so that, although there is a saving in surface area in comparison with the wire connecting technologies, a relatively complex connecting technique is required between the external contacts of the semiconductor chip and a wiring board or a leadframe.

SUMMARY

The invention provides an electronic component which can be produced at low cost and permits an improved packing density of semiconductor chips in a housing package.

In one embodiment, the invention is achieved by the subject matter of the independent claims. Advantageous developments of the invention emerge from the dependent claims.

In one embodiment, the invention specifies an electronic component with a housing package comprising a number of layers of plastic which has at least one buried interconnect layer and is provided with at least one semiconductor chip. This semiconductor chip has pointed-conical external contacts distributed on its outer side. These pointed-conical external contacts penetrate through one of the layers of plastic in the housing package and form contact vias to the at least one buried interconnect layer.

"Pointed-conical" is understood in this connection as meaning a body which has a base area and a height, its outer contour tapering with increasing height from the base area.

Such a component according to an embodiment of the invention can be realized at low cost by laminating semiconductor chips into a layer of plastic, without complex contact vias having to be provided in advance in the layer of plastic. This allows very flat overall heights to be realized, since the contacting with respect to the buried interconnect layer contributes virtually nothing to the height of the component because external contacts disappear in the interconnect layer as intended. In addition, there is no longer the necessity to provide an "underfill" layer for the subsequent filling of intermediate spaces between the semiconductor chip and an external interconnect layer. With the penetration of a layer of plastic by means of the pointed-conical external contacts of the semiconductor chip, at least the underside of the semiconductor chip and the pointed-conical external contacts are automatically surrounded by a plastic moulding compound. Consequently, no undesired cavities form.

On the other hand, it is possible, according to choice, to produce desired cavities in a defined manner, in that depressions are provided in the layer of plastic between the pointed-conical external contacts which penetrate through the layer of plastic, producing flat hollow housings, which are of advantage in particular for sensor technology. For this purpose, the housing package has a correspondingly structured layer of plastic.

The electronic component may be a multichip module with a number of buried interconnect layers and a number of semiconductor chips which have pointed-conical external contacts. In this case, the pointed-conical external contacts of the semiconductor chips in the housing package of the multichip module may penetrate through different layers of plastic and form contact vias with respect to different buried interconnect layers. This possible embodiment of the invention shows the great flexibility of this new technique, which makes it possible to construct housing packages and electronic components with such housing packages in which semiconductor chips are embedded in the housing package and/or the housing package is additionally loaded with semiconductor chips.

Consequently, the invention creates the possibility of the electronic component having buried semiconductor chips. A buried semiconductor chip in such a housing package comprising a number of layers of plastic can be realized just by a semiconductor chip of which the pointed-conical external contacts penetrate through a layer of plastic and contact a buried interconnect layer having a further layer of plastic arranged on it.

The space-saving advantage can be increased by thinned semiconductor chips with frustoconical external contacts being used as semiconductor chips. Such thinned semiconductor chips may have a thickness of between 30 and 100 micrometers as buried semiconductor chips and are protected from damage by a covering outer layer of plastic.

A multichip module may additionally have external contact areas on its upper side and/or its underside, which areas can be electrically connected to a higher-level circuit board or are applied to the external contacts in the form of solder balls or solder bumps. In principle, there is also the possibility that, with the new technique, a multichip has semiconductor chips on its upper side, which chips penetrate with their pointed-conical external contacts through the uppermost layer of plastic and form contact vias to a buried interconnect layer lying underneath it. It is also possible in this embodiment of the invention to dispense with contact vias provided in advance through the layer of plastic with respect to the buried interconnect layer, since the pointed-conical external contacts form contact vias when they penetrate through the uppermost layer of plastic.

In a further embodiment of the invention, the multichip module may additionally have passive components on its upper side, which components are then connected by means of separate contact vias in the uppermost layer of plastic to one of the buried interconnect layers or by means of contact vias through a number of layers of plastic to the external contact areas on the underside of the multichip module.

A further possibility for use of the housing package according to the invention is to provide electronic components with a hollow housing package, this hollow housing package having not only the layers of plastic but also the buried interconnect layer and at least one semiconductor chip with pointed-conical contacts. The layer of plastic which directly adjoins the semiconductor chip and through which the pointed-conical external contacts protrude thereby forms a frame of the hollow housing and has a depression inside the frame. For this purpose, this layer of plastic through which the pointed-conical external contacts of the semiconductor chip protrude is a structured layer of plastic. A further layer of plastic may form a covering of the depressions and thereby have contact vias which are electrically connected to the pointed-conical external contacts of the semiconductor chip.

In the simplest case of realizing a hollow housing package with the aid of the construction according to the invention, the hollow housing package merely comprises two layers of plastic. In this case, one forms the hollow housing frame with penetrated pointed-conical external contacts of the semiconductor chip and a further layer of plastic serves for covering the hollow housing or the depression which is surrounded by the frame. In this embodiment of the invention, the semiconductor chip forms a second covering of the hollow housing package, so that there is direct access to an upper side of the semiconductor chip, whereby contact sensors can be realized.

The hollow housing package may also serve the purpose of realizing pressure sensors. For this purpose, the covering layer of plastic may have a central opening, through which a connection to the ambient pressure is possible and for pressure exchange with the semiconducting sensor chip via the cavity formed. Furthermore, the hollow housing package according to the invention may also serve as a light sensor housing or chip camera housing, if the covering layer of plastic is produced from transparent plastic, such as acrylic glass, so that an exposure of the semiconductor chip becomes possible. In addition, the hollow housing package may also serve as a gas sensor housing, the covering layer of plastic having a central opening for gas exchange. To realize micro headphones and/or microphones, the hollow housing package may be formed as a sound sensor, the covering having a central opening for receiving sound or emitting sound.

In order to facilitate the penetration of the pointed-conical external contacts of the semiconductor chip through a layer of plastic, there is provided at least one layer of plastic comprising a pre-crosslinked plastic, which is only subsequently transformed into a crosslinked, and consequently cured, layer of plastic by thermal treatment. Such a pre-crosslinked layer of plastic may have glass fibers or carbon fiber reinforcements, in order to ensure the dimensional stability of the layer of plastic, although the actual crosslinking and curing has not yet taken place.

The invention relates not only to individual components but also to panels which have a number of component positions, the panels having a number of layers of plastic and at least one buried interconnect layer, and each component position having at least one semiconductor chip with pointed-conical external contacts distributed on an outer side. The pointed-conical external contacts in the panel penetrate through one of the layers of plastic and form contact vias with respect to the buried interconnect layer. Such a panel has the advantage that all the method steps can be carried out simultaneously and in parallel for a number of electronic components in the number of component positions, and also serves as a commodity, since with the finished panel a multiplicity of components can be supplied to the interim customer, and these are only separated into individual components after successful functional testing and successful transportation.

In the panel, each component position may have a multichip module with a number of buried interconnect layers and with a number of semiconductor chips which have pointed-conical external contacts. The pointed-conical external contacts of the semiconductor chips may penetrate through different layers of plastic in the panel and serve as contact vias to different buried interconnect layers. In addition, the panel may also have buried semiconductor chips which may be thinned semiconductor chips with a thickness of between 30 and 100 micrometers. This allows the panel to be constructed in an extremely flat form and be delivered as a thin plate.

On the upper side of the panel, additional semiconductor chips may be arranged in each component position, which chips penetrate with their pointed-conical external contacts through the uppermost layer of plastic of the panel and form interfacial contact with respect to a buried interconnect layer or are connected to contact vias which penetrate through the remaining layers of plastic as far as external contact areas on the underside of the panel. The panel may also already carry all the passive components of a multichip module in each of the component positions, so that the panel does not first have to be loaded by the customer. Such passive components may be connected to one of the buried interconnects by means of correspondingly provided contact vias in the layers of plastic or else by contact vias which pass through all the layers of plastic and are connected to the external contact areas on the underside of the panel.

Such a panel may also have in each of the component positions a hollow housing package, which on the one hand has a layer of plastic which has a depression for a hollow housing package in each component position and is structured in such a way that it forms the frame of the hollow housing package in each component position. In this case, the hollow housing package has in each component position at least one buried interconnect layer and at least one semiconductor chip, which penetrates with its pointed-conical external contacts through the frame-forming layer of plastic and forms interfacial contact with the buried interconnect layer. A further layer of plastic may be provided as a covering with contact vias, in order to terminate the hollow housing package.

The layers of plastic that are intended for penetration by pointed-conical external contacts of a semiconductor chip may have pre-crosslinkable layers of plastic, which has the advantage that the pre-crosslinkable layers of plastic are only crosslinked to form cured layers of plastic or thermoset layers in a thermal process after penetration of the pointed-conical external contacts of the semiconductor chip. In this case, the pre-crosslinkable layers of plastic, known as "pre-packs", may in particular have glass fibers or carbon fiber reinforcements, in order to ensure a limited dimensional stability even in the pre-crosslinked state.

A method for producing at least one electronic component with a housing package comprising a number of layers of plastic with at least one buried interconnect layer and at least one semiconductor chip which has pointed-conical external contacts distributed on its outer side has the following method.

A circuit carrier with external contact areas on the underside of the circuit carrier and with an interconnect layer on the upper side of the circuit carrier is produced, the external contact areas and the interconnect layer being electrically connected by means of contact vias through the circuit carrier. Independently of producing a circuit carrier, semiconductor chips with pointed-conical external contacts may be produced on semiconductor wafers, in order to use them after dividing up the semiconductor wafer into individual semiconductor chips with pointed-conical external contacts for producing an electronic component with a housing package.

A pre-crosslinked layer of plastic is applied to the circuit carrier, or to the interconnect layer on the upper side of the circuit carrier. This pre-crosslinked layer of plastic can be transformed into a viscous state, so that the semiconductor chips can advantageously be applied to the pre-crosslinked layer of plastic with minimal compressive loading. In this case, the pointed-conical external contacts of at least one semiconductor chip penetrate through the pre-crosslinked layer of plastic until they form contact vias with respect to the interconnect layer on the upper side of the circuit carrier and the semiconductor chip impresses itself in the pre-crosslinked layer of plastic.

The pre-crosslinked layer of plastic is cured and crosslinked to form a layer of plastic. After this working step, the functional testing of the electronic component can be carried out by means of the external contact areas of the circuit carrier. This method has the advantage that extremely low-cost electronic components can be produced, especially since there is no longer a need for any wire bonding operation. In comparison with flip-chip technology, which also manages without wire bonding, this method has the advantage that the external contacts of a semiconductor chip do not have to be subsequently and cost-intensively embedded in an "underfill layer", since the pointed-conical external contacts of the semiconductor chip penetrate through a pre-crosslinked layer of plastic and assume contact with a buried interconnect layer, the semiconductor chip at the same time being impressed in this layer of plastic.

Before the curing and crosslinking of the pre-crosslinked layer of plastic, a further pre-crosslinked layer of plastic may be applied to the semiconductor chip. This layer of plastic covers the semiconductor chip and protects it from mechanical damage. This produces a housing package comprising a number of layers of plastic with a buried semiconductor chip.

A number of sequences of interconnect layers and layers of plastic with contact vias and embedded semiconductor chips may be applied to the circuit carrier, the pointed-conical external contacts of the semiconductor chip respectively penetrating through one of the layers of plastic and thereby forming contact vias to one of the buried interconnect layers, thereby producing a multichip module which even on its uppermost layer of plastic may also have upper interconnect layers which are loaded with semiconductor chips and/or passive components.

These method steps described above may also be carried out for producing a panel with a number of component positions to produce a number of electronic components, the panel already being a saleable commodity. It is finally divided up into individual electronic components by the respective customer. The production and shipping of a panel have the advantage that components of the panel that have been tested as serviceable are identified, so that only tested components are removed from the panel by the customer.

To sum up, it can be stated that the contact areas of semiconductor chips are provided with pointed-conical external contacts. These pointed-conical external contacts are pressed through a layer of plastic for contacting. On the side of the layer of plastic opposite from the semiconductor chip, the pointed-conical external contacts meet a metallization of a circuit carrier, with which an electrical contact is formed. By this technique it is also possible to realize electronic components which have not only buried interconnect layers but also buried semiconductor chips, in that at least one further layer of plastic is arranged over the semiconductor chips.

The device according to the invention and the method according to the invention have the following advantages:

1. A low-cost lamination of chips between housing packages in the form of layers of plastic is achieved without a complex interfacial connecting technique.
2. Housing packages analogous to flip-chip packages can be realized without the necessity for "underfill layers".
3. Very flat overall heights can be realized, especially since the contacting contributes virtually nothing to the overall height. Ultrathin semiconductor chips, which for their part have improved flexibility, make it possible for these semiconductor chips to be incorporated between substrate layers, which minimizes the overall height by the external contacts not affecting the height of the component, because the pointed-conical external contacts can disappear in the layer of plastic of the substrate.
4. The realization of a flat hollow housing package is possible, in that the combination of the wiring according to the invention of the semiconductor chip by its pointed-conical contacts can be combined with depressions in a layer of plastic. Such housings with a flat cavity which surrounds the active semiconductor surface can be used in particular in sensor technology for pressure and gas sensors, in acoustics for the production of microphones, headphones and hearing aids, in optics for chip cameras and light-emitting diodes and in filter technology for high-frequency filters in mobile radio.
5. The technique according to the invention makes it possible to realize complex multichip modules which can have contacts on both sides, that is on the upper side and/or the underside, and which can be loaded with additional semiconductor chips and/or passive components on its upper side and/or underside.
6. With the technique according to the invention, flat-conductor-free housing packages with corresponding wiring planes can also be constructed.
7. The contacts produced by pressing the pointed-conical contacts into a layer of plastic are so reliable that they can be used in "high-performance burial" applications, such as for example in high-frequency engineering.

In the case in which mounting of a panel is envisaged, this panel can be configured in the standard 18"×24" PCB format. For surface mounting, the PCB panel can be separated into a number of individual mounting panels and, in such surface mounting, the final electronic component with a housing package can be produced by subsequent singulating by means of sawing or breaking.

To form reliable electrical contacts between the pointed-conical external contacts and the buried interconnect layer, during the curing of the pre-crosslinked layers of plastic an additional heat treatment may possibly be carried out simultaneously with pressure on the overall housing package.

BRIEF DESCRIPTION OF THE DRAWINGS

The invention is now explained in more detail on the basis of exemplary embodiments with reference to the accompanying figures.

FIGS. 6 to 12 illustrates schematic cross sections through components of a panel after method steps for producing an electronic component according to the first embodiment of the invention.

FIG. 6 illustrates a schematic cross section through a circuit carrier of a panel with an interconnect layer on its upper side, with external contact areas on its underside and with contact vias with respect to the external contact areas in a component position of the panel.

FIG. 7 illustrates a schematic cross section through a circuit carrier of a panel after applying a pre-crosslinked layer of plastic to the upper side of the circuit carrier.

FIG. 8 illustrates a symmetrical section through a semiconductor chip with pointed-conical external contacts after alignment in a component position of the panel.

FIG. 9 illustrates a schematic cross section through a component position of a panel after penetration of the pre-crosslinked layer of plastic by the pointed-conical external contacts of the semiconductor chip and after contacting of the pointed-conical external contacts with a buried interconnect layer.

FIG. 10 illustrates a schematic cross section through a further pre crosslinked uppermost layer of plastic of a panel after positioning above a component position with a semiconductor chip, FIG. 11 illustrates a schematic cross section through a panel after applying the further pre-crosslinked uppermost layer of plastic and curing the layers of plastic of the panel, with electrical connection of the pointed-conical external contacts of the semiconductor chip to the buried interconnect layer, FIG. 12 illustrates a symmetrical section through an electronic component after separating the panel into individual electronic components.

DETAILED DESCRIPTION

Figure 1:
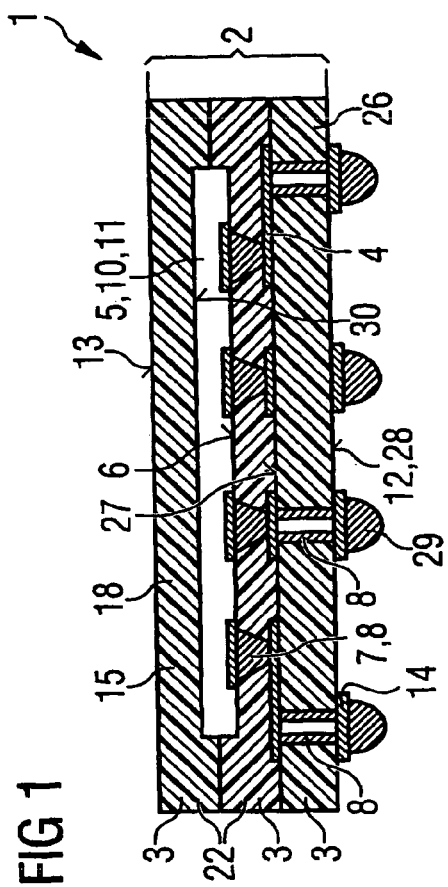
FIG. 1 illustrates a schematic cross section of an electronic component of a first embodiment of the invention.

FIG. 1 illustrates a schematic cross section of an electronic component 1 of a first embodiment of the invention. The reference numeral 2 designates a housing package, which is made up of three layers of plastic 3. Arranged between the layers of plastic 3 is at least one buried interconnect layer 4. This interconnect layer 4 lies on the upper side 27 of a circuit carrier 26, which carries the housing package.

The circuit carrier 26 of this embodiment of the invention has a layer of plastic 3, on the upper side 27 of which the buried interconnect layer is arranged and which is electrically connected by means of contact vias 8 to external contact areas 14 arranged on the underside 28 of the circuit carrier 26. In this first embodiment of the invention, external contact balls 29 of the electronic component 1 are arranged on the external contact areas 14.

The reference numeral 22 designates a pre-crosslinkable plastic of a layer of plastic 3 on the circuit carrier 26, which is penetrated by pointed-conical external contacts 7 of a semiconductor chip 5, which with their cone tips establish electrical connections with respect to the buried interconnect layer 4. The semiconductor chip 5 is impressed with its outer side 6, which has the pointed-conical external contacts 7, in the layer of plastic 3 comprising pre-crosslinked plastic 22. The housing package 2 is terminated by an uppermost layer of plastic 15, which likewise comprises a pre-crosslinked plastic 22 and covers the rear side 30 of the semiconductor chip 5, so that the semiconductor chip 5 is a buried semiconductor chip 10.

The housing package 2 comprising the three layers of plastic 3 with the one buried interconnect structure 4 can not only be produced extremely inexpensively but also be realized very compactly and consequently with an extremely small overall height, in particular whenever the semiconductor chip 5 is a thinned semiconductor chip 11, which has a thickness of between 30 and 100 micrometers and in extreme cases can assume a thickness of below 30 micrometers. This allows the total height of the component, essentially determined by the layer thicknesses of the three layers of plastic, between the underside 12 and the upper side 13 to lie between 100 and 500 micrometers.

Figure 2:
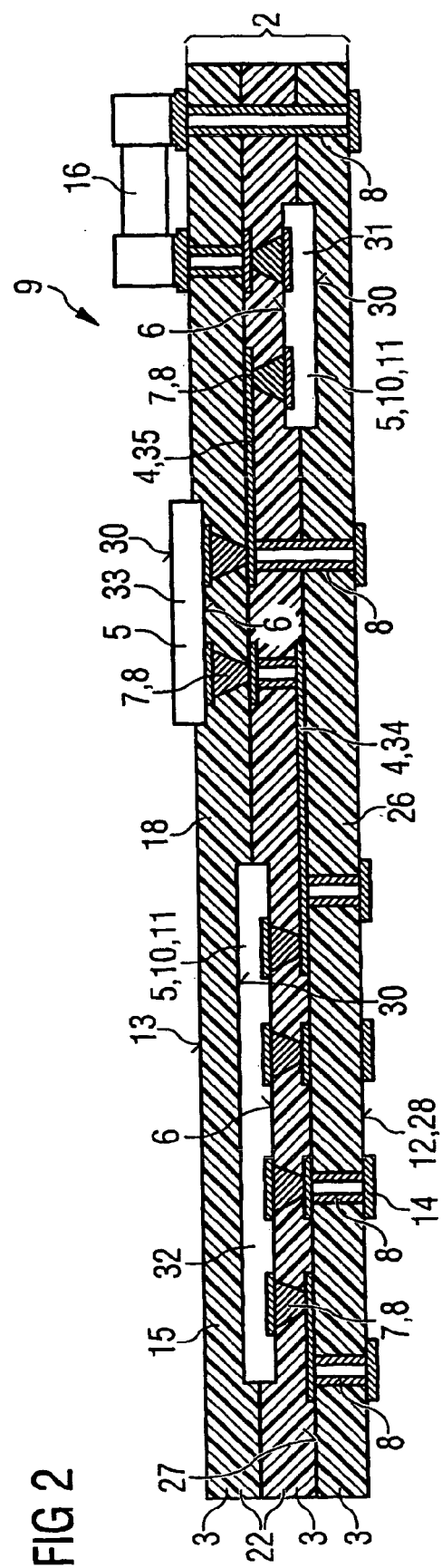
FIG. 2 illustrates a schematic cross section of an electronic component of a second embodiment of the invention.

FIG. 2 illustrates a schematic cross section of an electronic component 1 of a further embodiment of the invention. Components with the same functions as in FIG. 1 are designated by the same reference numerals and are not separately explained.

The second embodiment of the invention represents a multichip module in schematic cross section, which in this embodiment and in this cross section has three semiconductor chips 31, 32 and 33, which are arranged in different positions in or on the housing package 2 of the multichip module 9. Arranged between three layers of plastic 3 in this embodiment of the invention are two buried interconnect layers 34 and 35. In this embodiment, the circuit carrier 26 is likewise produced from a pre-crosslinkable plastic 22, so that the semiconductor chip 31 can be impressed with its passive rear side 30 in the pre-crosslinked plastic 22 before complete crosslinking of the layers of plastic 3 is carried out.

The active upper side of the semiconductor chip 31 has pointed-conical external contacts 7, which penetrate as contact vias 8 through the middle layer of plastic 3 of the multichip module and are connected to the interconnect layer 35 between the uppermost two layers of plastic. The semiconductor chip 32 is arranged as a buried semiconductor chip 10 in a way analogous to the first embodiment of the invention and contacts the lower interconnect layer 35 of the buried interconnect layers 4, its pointed-conical external contacts likewise penetrating through the middle layer of plastic of the housing package 2. The third semiconductor chip 33 in this multichip module 9 is arranged on the upper side 13 of the latter and penetrates with its pointed-conical external contacts 7 through the uppermost layer of plastic 15 of the multichip module.

The multichip module may be loaded both with further semiconductor chips 5 and with passive components 16 on its upper side 13, while its underside 12 has external contact areas 14, which may be equipped with external contact balls (not shown). The passive components 16 may be connected both with their electrodes by means of contact vias 8 to the individual buried interconnect layers 34 or 35 and directly to the external contact areas 14. Such an electronic component 1 according to the invention is distinguished by the fact that no bonding connections have to be provided and also the contact vias 8 to be provided in the individual layers of plastic 3 can be minimized, especially since the pointed-conical external contacts 7 of the semiconductor chips directly form contact vias 8 through the individual layers of plastic 3.

Figure 3:
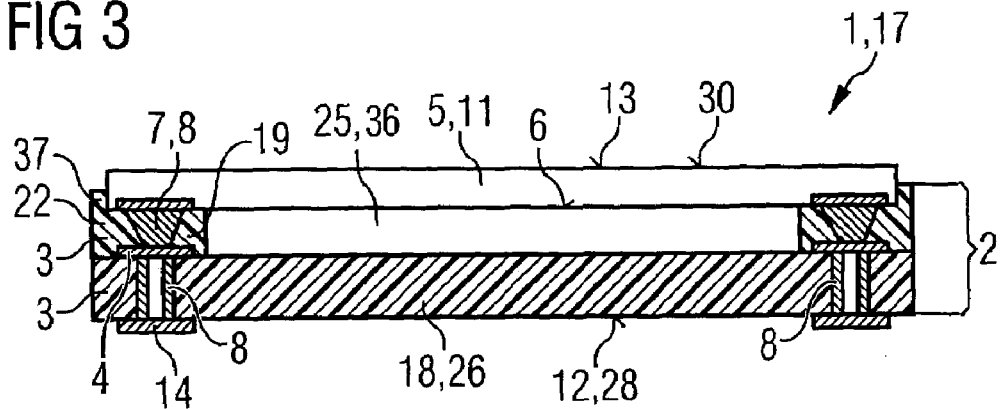
FIG. 3 illustrates a schematic cross section of an electronic component of a third embodiment of the invention.
Figure 4:
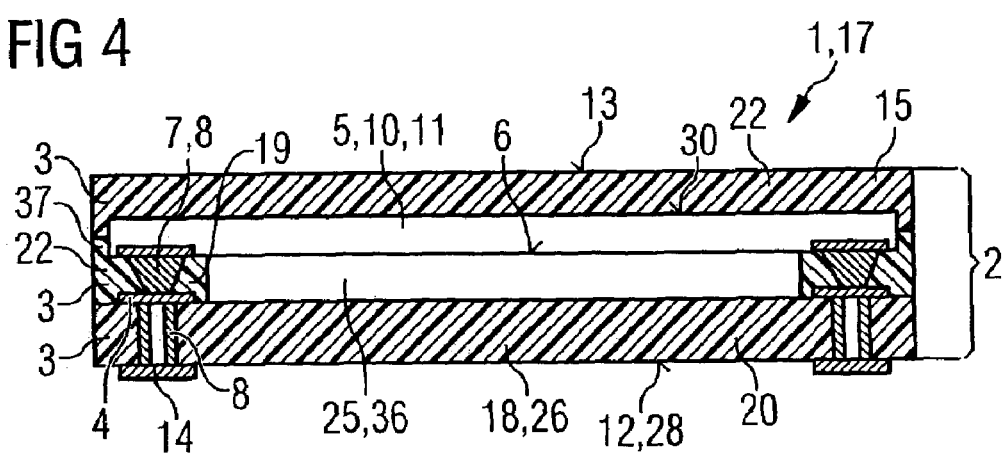
FIG. 4 illustrates a schematic cross section of an electronic component of a fourth embodiment of the invention.
Figure 5:
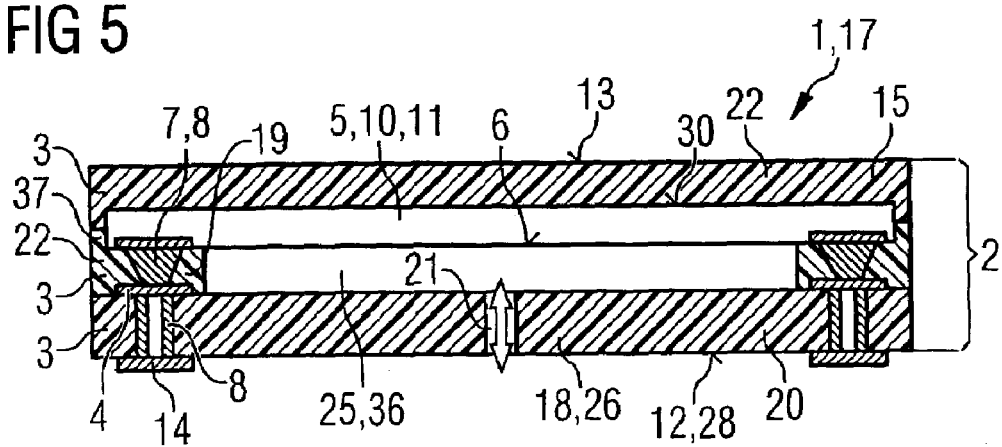
FIG. 5 illustrates a schematic cross section of an electronic component of a fifth embodiment of the invention.

FIGS. 3 to 5 illustrates exemplary embodiments of forms of the electronic components, as may be provided in particular in sensor technology, acoustics, optics or in filter technology, for example for high-frequency filters and for mobile radio technology. All three embodiments share the common feature that they realize a hollow housing package. Components of FIGS. 3 to 5 which have the same functions as in the previous figures are designated by the same reference numerals and are not separately explained.

FIG. 3 illustrates a schematic cross section of an electronic component 1 of a third embodiment of the invention, thereby realizing a first hollow housing package 17, which has an extremely flat cavity 36. The housing package 2 of this hollow housing package 17 has essentially two layers of plastic. On the one hand a structured layer of plastic 37, which forms the frame 19 for the cavity housing package, the frame 19 being penetrated by pointed-conical external contacts 7 of the semiconductor chip 5. The semiconductor chip 5 at the same time forms with its upper surfaces the upper side 13 of the electronic component 1.

The depression 25 in the structured layer of plastic 37 is covered by a closed layer of plastic in the form of a covering 18, which has similar functions to the circuit carrier 26 in the previous exemplary embodiments, since the covering 18 at the same time carries a buried interconnect layer 4, which is in connection with external contact areas 14 on the covering 18 by means of contact vias 8. Such a hollow housing package 17, as shown in FIG. 3, may be used for contact sensors, as are provided in notebooks, computers or cash dispensers, especially since an upper side of the semiconductor chip 5 at the same time forms the upper side 13 of the sensor, while the covering 18 of the cavity 36 has the underside 12 of this hollow housing package.

FIG. 4 illustrates a schematic cross section of an electronic component 1 of a fourth embodiment of the invention. This fourth embodiment of the invention differs from the third embodiment of the invention as shown in FIG. 3 in that the semiconductor chip 5 is formed as a buried semiconductor chip 10, in that an upper layer of plastic 15 covers the semiconductor chip 5 and at the same time protects it from contact. Such an electronic component with a flat cavity 36 may be used in particular for precision high-frequency filters, the filter structure being arranged on the active upper side 6 of the semiconductor chip 5 and connected by means of the pointed-conical external contacts 7 of the semiconductor chip 5 with contact vias 8 through the covering 18 of the hollow housing package 17 to external contact areas 14 on the underside 12 of the housing package 2. In this fourth embodiment of the invention, the housing package comprises three layers of plastic 3 with a buried interconnect layer 4, while the housing package 2 in the third embodiment of the invention only has two layers of plastic 3 with a buried interconnect layer 4 lying in between.

FIG. 5 illustrates a schematic cross section of an electronic component 1 of a fifth embodiment of the invention. This fifth embodiment of the invention differs from the fourth embodiment in that the covering 18 has a central opening 21 to the cavity 36. The central opening serves for the gas coupling of a gas sensor, for example, or may also serve for the sound coupling of a sound sensor, such as a microphone or micro headphones.

FIGS. 6 to 12 illustrate schematic cross sections through components of a panel 24 after individual method steps for producing an electronic component 1 according to the first embodiment of the invention. Components of FIGS. 6 to 12 which perform the same functions as in the previous figures are designated by the same reference numerals.

FIG. 6 illustrates a schematic cross section through a circuit carrier 26 of a panel 24 with an interconnect layer 4 on its upper side 27, with external contact areas 14 on its underside 28 and with contact vias 8 with respect to the external contacts 14 in a component position 23. Such a circuit carrier 26 may be reinforced with glass fibers or carbon fibers to increase the dimensional stability. The dotted lines 38 designate the limits of a component position 23 of the panel 24. The circuit carrier may already consist of crosslinked plastic and have on its upper side a structured copper layer as the interconnect layer 4. This interconnect layer 4 is connected by means of contact vias 8 of copper or copper alloy to external contact areas 14, which are provided on the underside 28 of the circuit carrier 26.

FIG. 7 illustrates a schematic cross section through a circuit carrier 26 of a panel 24 after application of a pre-crosslinked layer of plastic 22 to the upper side 27 of the circuit carrier 26. Such a pre-crosslinked layer of plastic 22 is relatively soft in relation to the already crosslinked and cured plastic of the circuit carrier 26 and can consequently be deformed without expending excessive forces. This deformability of a pre-crosslinked plastic is used in the next step, which is shown by FIGS. 8 and 9, to reduce the production costs of electronic components.

FIG. 8 illustrates a schematic cross section through a semiconductor chip 5 or a thinned semiconductor chip 11 with pointed-conical external contacts 7 after alignment of the semiconductor chip 5, 11 above a component position 23 of the panel 24. This semiconductor chip 5, 11 is arranged with its pointed-conical external contacts 7 above the layer of plastic 3 comprising pre-crosslinked plastic 22 and, after the positioning which is shown in FIG. 8, will in FIG. 9 penetrate with its pointed-conical external contacts through the layer of plastic 3.

FIG. 9 illustrates a schematic cross section through a component position 23 of a panel 24 after penetration of the pre-crosslinked layer of plastic 22 by the pointed-conical external contacts of the semiconductor chip 5, 11 and after contacting of the pointed-conical external contacts 7 of the semiconductor chip 5, 11 with a buried interconnect layer 4. By applying the pre-crosslinkable layer of plastic 22 in FIG. 7, the interconnect layer originally arranged on the upper side 27 of the circuit carrier 26 becomes a buried interconnect layer 4. In FIG. 9, this buried interconnect layer 4 is contacted with the semiconductor chip 5 after penetration of the layer of plastic 3 with the aid of the pointed-conical external contacts 7 of the semiconductor chip 5. As this happens, the outer side 6 of the semiconductor chip 5, which carries the pointed-conical external contacts 7, becomes impressed in the pre-crosslinked layer of plastic 22.

Figure 10:
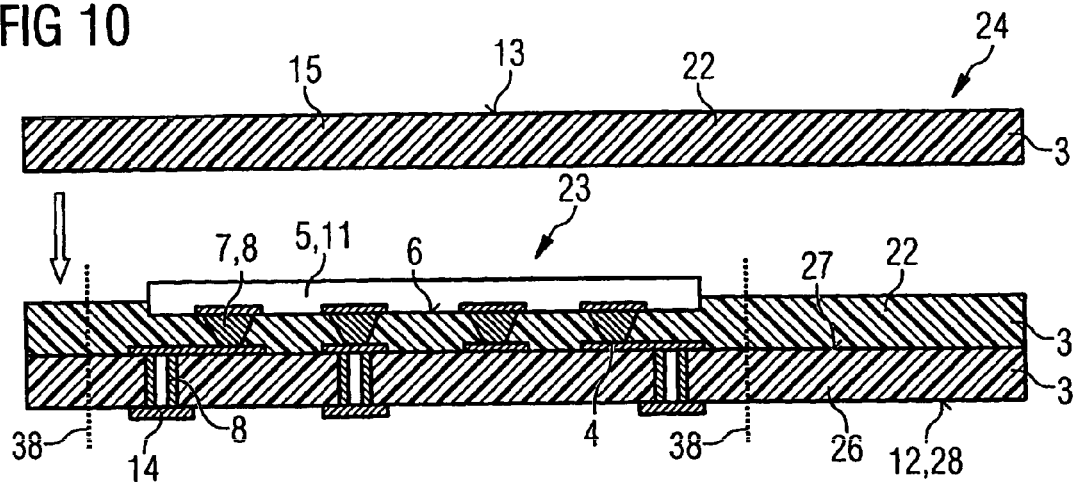

FIG. 10 illustrates a schematic cross section through a further pre-crosslinked uppermost layer of plastic 15 of a panel 24 after positioning above a component position 23 with the semiconductor chip 5. As FIG. 11 shows, the semiconductor chip 5 can be completely covered by this uppermost layer of plastic 15, which is positioned in FIG. 10.

Figure 11:
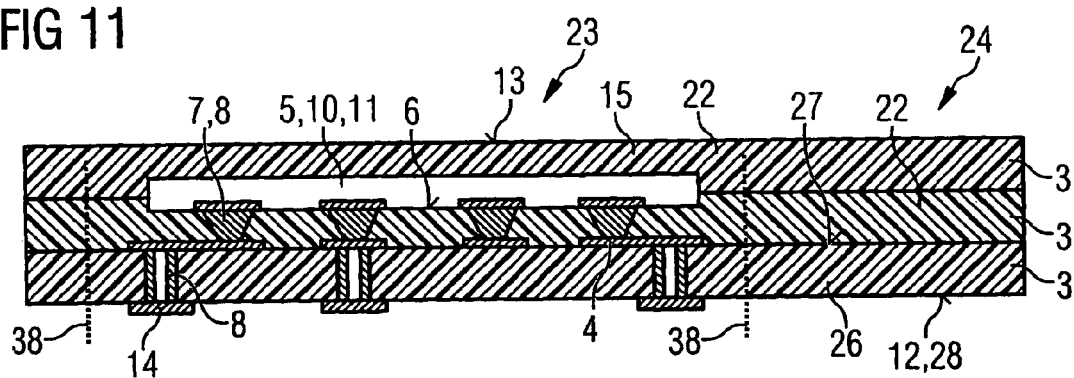

FIG. 11 illustrates a schematic cross section through a panel 24 after application of the further pre-crosslinked uppermost layer of plastic 15 and curing of the layers of plastic 15 and 22 of the panel 24 with electrical connection of the pointed-conical external contacts 7 of the semiconductor chip 5 to the buried interconnect layer 4. FIG. 11 consequently shows the result of two method steps, that is on the one hand the application of the positioned uppermost layer of plastic 15 in the direction of the arrow A, as it is shown in FIG. 10, onto the panel 24 and additionally the further step of curing and crosslinking the layers of plastic 15 and 22 with simultaneous electrical connection of the points of the pointed-conical external contacts 7 with respect to the buried interconnect layer 4, so that the pointed-conical external contacts 7 virtually become contact vias 8 through the middle of the three layers of plastic 3.

With the panel completed in FIG. 11, a number of electronic components are simultaneously produced in the component positions 23 of the panel. For this purpose, the panel may be configured in a standard PCB format of 18"×24". For surface mounting of additional components on the panel, the panel may be separated into a number of individual mounting panels and, after surface mounting of additional components, singulating of the panel into individual multichip modules may take place by sawing, milling or by breaking.

In the embodiment illustrated here, however, a single electronic component 1 with only a single electronic semiconductor chip 5, 11, without the upper side 13 being loaded with further components, is shown, as corresponds to the first embodiment of the invention.

Figure 12:
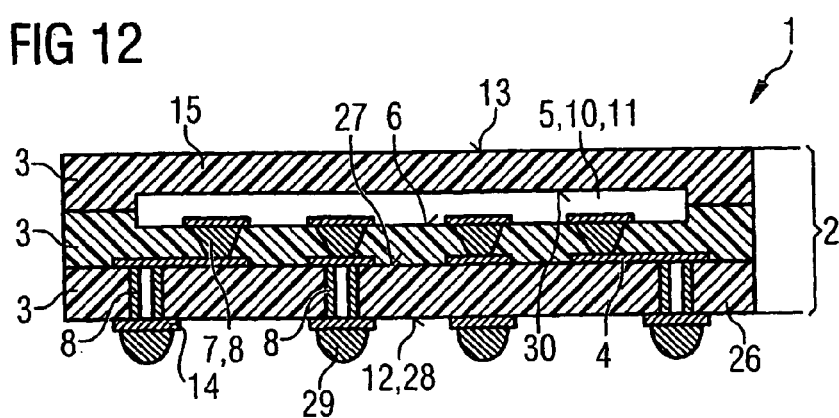

FIG. 12 illustrates a schematic cross section through an electronic component 1 after separation of the panel 24 into individual electronic components 1. The schematic cross section as shown in FIG. 12 consequently corresponds to the schematic cross section as already known from FIG. 1. The external contact balls 29, which are shown here only after the individual separation of the electronic components 1, can also be applied to the external contact areas 14 of the panel during the production of the panel, before the panel is separated into individual electronic components 1 by sawing, milling or breaking.

The invention claimed is:

1. An electronic component comprising:
   a housing package comprising a plurality of layers of plastic;
   at least one buried interconnect layer; and
   at least one semiconductor chip, which has pointed-conical external contacts distributed on an outer side, the pointed-conical external contacts penetrating through one of the layers of plastic in the housing package and forming contact vias to the buried interconnect layer,
   wherein an underside of the semiconductor chip and the pointed-conical external contacts are surrounded by one of the layers of plastic;
   wherein the pointed-conical external contacts maintain a pointed-conical configuration within the layers of plastic.

2. The electronic component claim 1, comprising wherein the electronic component has external contact areas in each component position on the underside and/or the upper side.

3. The electronic component of claim 1, comprising wherein the electronic component has passive components on its upper side, the components being connected by means of contact vies in the uppermost layer of plastic to one of the buried interconnect layers.

4. The electronic component of claim 1, comprising wherein the electronic component has at least one layer of plastic of a pre-crosslinked plastic.

5. The electronic component of claim 1, comprising wherein the electronic component has at least one layer of plastic with glass fiber or carbon fiber reinforcements.

* * * * *

UNITED STATES PATENT AND TRADEMARK OFFICE
CERTIFICATE OF CORRECTION

| | | |
|---|---|---|
| PATENT NO. | : 7,319,598 B2 | Page 1 of 1 |
| APPLICATION NO. | : 10/519215 | |
| DATED | : January 15, 2008 | |
| INVENTOR(S) | : Rainer Steiner and Horst Theuss | |

It is certified that error appears in the above-identified patent and that said Letters Patent is hereby corrected as shown below:

Column 12, Claim 3, line 29, delete "vies" and insert in place thereof --vias--.

Signed and Sealed this

Eighth Day of July, 2008

JON W. DUDAS
*Director of the United States Patent and Trademark Office*